US006381136B1

(12) United States Patent
Nelson et al.

(10) Patent No.: US 6,381,136 B1
(45) Date of Patent: Apr. 30, 2002

(54) DUAL SPRING CLIP ATTACHMENT MECHANISM FOR CONTROLLED PRESSURE INTERFACE THERMAL SOLUTION ON PROCESSOR CARTRIDGES

(75) Inventors: Daryl J. Nelson, Beaverton, OR (US); Michael Stark, Tempe, AZ (US); Michael Rutigliano, Chandler, AZ (US); Lee Topic, Chandler, AZ (US); Yoke Chung, Chandler, AZ (US); Mark Thurston, Tokyo (JP)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/541,822

(22) Filed: Apr. 3, 2000

Related U.S. Application Data

(63) Continuation of application No. 09/024,539, filed on Feb. 17, 1998, now Pat. No. 6,046,905, which is a continuation-in-part of application No. 08/723,027, filed on Sep. 30, 1996, now Pat. No. 5,838,542.

(51) Int. Cl.[7] .............................................. H05K 7/20
(52) U.S. Cl. ........................ 361/704; 257/718; 361/715; 361/737
(58) Field of Search .............................. 165/80.2, 185; 174/16.3; 257/718–719, 726–727; 361/704, 707, 709–710, 715, 716–721, 737, 753, 759

(56) References Cited

U.S. PATENT DOCUMENTS

| 3,801,874 A | * | 4/1974 | Stefani .................... 317/100 |
| 3,895,267 A |   | 7/1975 | Gordon et al. |
| 4,110,552 A |   | 8/1978 | Lombardi |
| 4,266,267 A | * | 5/1981 | Ruegg ....................... 361/386 |
| 4,521,827 A | * | 6/1985 | Jordan et al. ............... 361/386 |
| 4,602,315 A | * | 7/1986 | Breese ....................... 361/388 |
| 4,652,971 A | * | 3/1987 | Peterson et al. ............ 361/386 |
| 4,717,989 A |   | 1/1988 | De Barros et al. |
| 4,910,434 A |   | 3/1990 | Doumani et al. |
| 5,006,667 A |   | 4/1991 | Lonka |
| 5,014,160 A |   | 5/1991 | McCoy, Jr. |
| 5,020,866 A |   | 6/1991 | McIlwraith |
| 5,043,534 A |   | 8/1991 | Mahulikar et al. |
| 5,168,926 A |   | 12/1992 | Watson et al. |
| RE34,393 E  |   | 9/1993 | McIlwraith |
| 5,250,752 A |   | 10/1993 | Cutright |
| 5,278,351 A |   | 1/1994 | Herrick |
| 5,289,337 A |   | 2/1994 | Aghazadeh et al. |
| 5,289,347 A |   | 2/1994 | McCarthy et al. |
| 5,294,994 A |   | 3/1994 | Robinson et al. |
| 5,303,113 A |   | 4/1994 | Goleman et al. |
| 5,309,315 A |   | 5/1994 | Naedel et al. |
| 5,323,299 A |   | 6/1994 | Weber |
| 5,333,100 A |   | 7/1994 | Anhalt et al. |
| 5,354,951 A |   | 10/1994 | Lange, Sr. et al. |
| 5,398,822 A |   | 3/1995 | McCarthy et al. |
| 5,422,433 A |   | 6/1995 | Rivera et al. |

(List continued on next page.)

Primary Examiner—Gregory Thompson
(74) Attorney, Agent, or Firm—Blakely, Sokoloff, Taylor & Zafman LLP

(57) ABSTRACT

An electronic cartridge that includes a pair of spring clips which attach a thermal element to an integrated circuit or an integrated circuit package. The integrated circuit/package is mounted to a substrate. The substrate may be a printed circuit board. The cartridge may have a plurality of pins that extend from the thermal element and through the substrate. Each spring clip may have a pair of bent portions that are attached to the pins of the thermal element. The spring clip exerts a pull force that pulls the thermal element into the integrated circuit/package. The bent ports can be deflected so that at least a minimum pull force is always exerted onto the thermal element even with dimensional variations in the parts of the cartridge. The bent portions can therefore accommodate for tolerances in the cartridge while clamping the thermal element to the integrated circuit/package.

41 Claims, 2 Drawing Sheets

U.S. PATENT DOCUMENTS

| | | |
|---|---|---|
| 5,430,607 A | 7/1995 | Smith |
| 5,473,111 A | 12/1995 | Hattori et al. |
| 5,477,421 A | 12/1995 | Bethurum |
| 5,483,423 A | 1/1996 | Lewis et al. |
| 5,550,713 A | 8/1996 | Pressler et al. |
| 5,617,294 A | 4/1997 | Watson et al. |
| 5,642,263 A | 6/1997 | Lauruhn |
| 5,659,459 A | 8/1997 | Wakabayashi et al. |
| 5,699,229 A | 12/1997 | Brownell |
| 5,726,865 A | 3/1998 | Webb et al. |
| 5,734,555 A | 3/1998 | McMahon |
| 5,748,446 A | 5/1998 | Feightner et al. |
| 5,784,263 A | 7/1998 | Nelson |
| 5,829,601 A | 11/1998 | Yurchenco et al. |
| 5,838,542 A | 11/1998 | Nelson et al. |
| 5,854,738 A | 12/1998 | Bowler |
| 5,856,910 A | 1/1999 | Yurchenco et al. |
| 5,883,782 A * | 3/1999 | Thurston et al. ............ 257/718 |
| 5,883,783 A * | 3/1999 | Turturro .................... 361/704 |
| 5,894,408 A | 4/1999 | Stark et al. |
| 5,895,972 A | 4/1999 | Paniccia |
| 5,898,219 A | 4/1999 | Barrow |
| 5,903,436 A | 5/1999 | Brownell et al. |
| 5,912,802 A | 6/1999 | Nelson |
| 5,933,323 A | 8/1999 | Bhatia et al. |
| 5,933,324 A | 8/1999 | Barrett |
| 5,936,838 A | 8/1999 | Lii et al. |
| 5,965,937 A | 10/1999 | Chiu et al. |
| 5,973,399 A | 10/1999 | Stark et al. |
| 5,990,549 A * | 11/1999 | Chiu et al. .................. 257/706 |
| 6,008,988 A | 12/1999 | Palmer |
| 6,011,696 A | 1/2000 | Mahajan et al. |
| 6,025,990 A | 2/2000 | Daskalakis et al. |
| 6,028,771 A | 2/2000 | Wong et al. |
| 6,043,983 A | 3/2000 | Taylor et al. |
| 6,043,984 A | 3/2000 | Tseng |
| 6,046,906 A | 4/2000 | Tseng |
| 6,061,240 A * | 5/2000 | Butterbaugh et al. ....... 361/704 |
| 6,068,051 A | 5/2000 | Wendt |

* cited by examiner

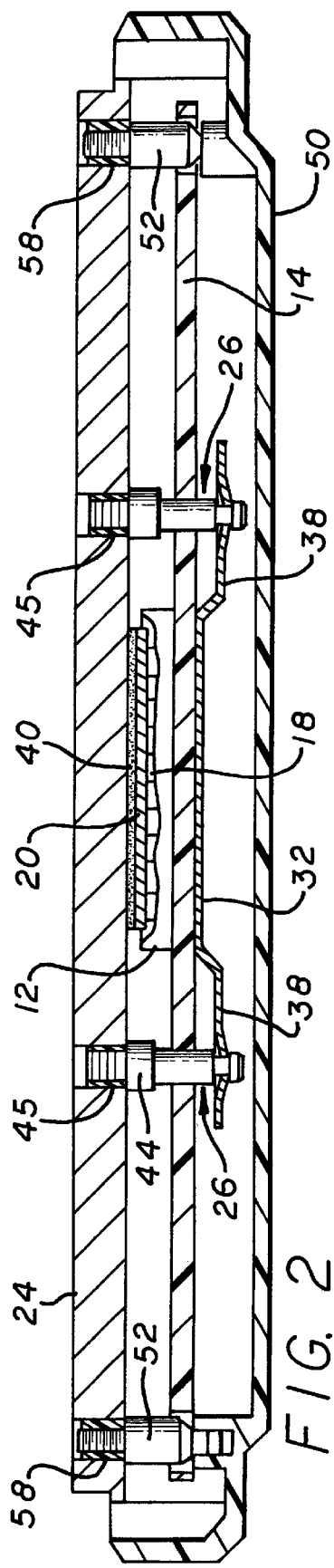
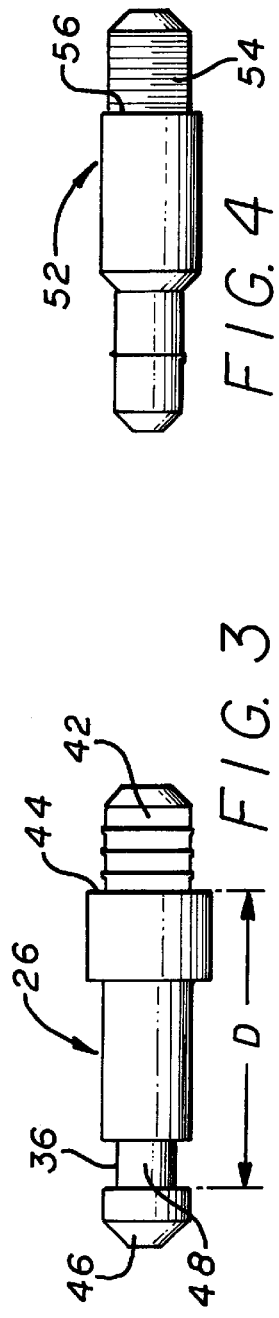
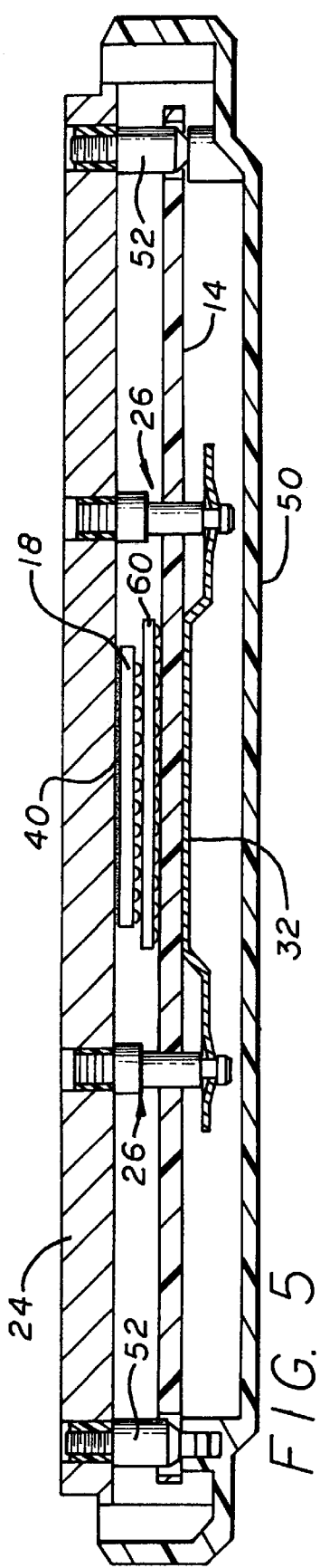

DUAL SPRING CLIP ATTACHMENT MECHANISM FOR CONTROLLED PRESSURE INTERFACE THERMAL SOLUTION ON PROCESSOR CARTRIDGES

CROSS-REFERENCE TO RELATED APPLICATIONS

This application claims the benefit of and is a continuation of application Ser. No. 09/024,539, filed Feb. 17, 1998, now issued as U.S. Pat. No. 6,046,905 which is a Continuation-in-Part application of application Ser. No. 08/723,027, filed Sep. 30, 1996, now issued as U.S. Pat. No. 5,838,542.

BACKGROUND OF THE INVENTION

1. Field of the Invention

The present invention relates to a spring clip that couples a thermal element to an integrated circuit or integrated circuit package.

2. Background Information

Integrated circuits are assembled into packages that are soldered to printed circuit boards. The integrated circuits generate heat which must be removed to insure that the junction temperatures of the circuits operate below threshold levels. The heat generated by each integrated circuit primarily flows through the package. The package is typically constructed from a dielectric material which has a relatively low coefficient of thermal conductivity. The low thermal coefficient increases the temperature drop across the package and the junction temperature of the circuit.

Some packages contain a metal lid that reduces the thermal impedance between the integrated circuit and the ambient. A heat sink may be coupled to the metal lid to further improve the thermal efficiency of the assembly.

The surface roughness and a lack of co-planarity between the metal lid and the heat sink may create air gaps within the metal lid/heat sink interface. The air gaps increase the thermal impedance between the metal lid and the heat sink. The increase in thermal impedance may raise the junction temperature of the integrated circuit.

Some assemblies utilize a fastener such as a clip or a screw that pulls the heat sink into the metal lid. The pull force of the fastener decreases the thermal impedance of the metal lid/heat sink interface. Variations in the height of the integrated circuit package due to manufacturing tolerances may change the pull force of the fastener. The tolerances may create an undesirable reduction in the pull force and an increase in the thermal impedance of the metal lid/heat sink interface. It would be desirable to provide a clamping fastener for an electronic assembly which accommodates tolerances in the assembly.

SUMMARY OF THE INVENTION

One embodiment of the present invention is an electronic cartridge that includes a spring clip which attaches a thermal element to an integrated circuit or an integrated circuit package. The integrated circuit/package is mounted to a substrate. The cartridge may have a pin that extends from the thermal element and through the substrate. The spring clip is attached to the pin of the thermal element.

BRIEF DESCRIPTION OF THE DRAWINGS

FIG. 2 is a top cross-sectional view of the cartridge;

FIG. 3 is a side view of a pin of the cartridge;

FIG. 4 is a side view of another pin of the cartridge;

FIG. 5 is a top view of an alternate embodiment of the cartridge.

DETAILED DESCRIPTION OF THE INVENTION

Figure 1:
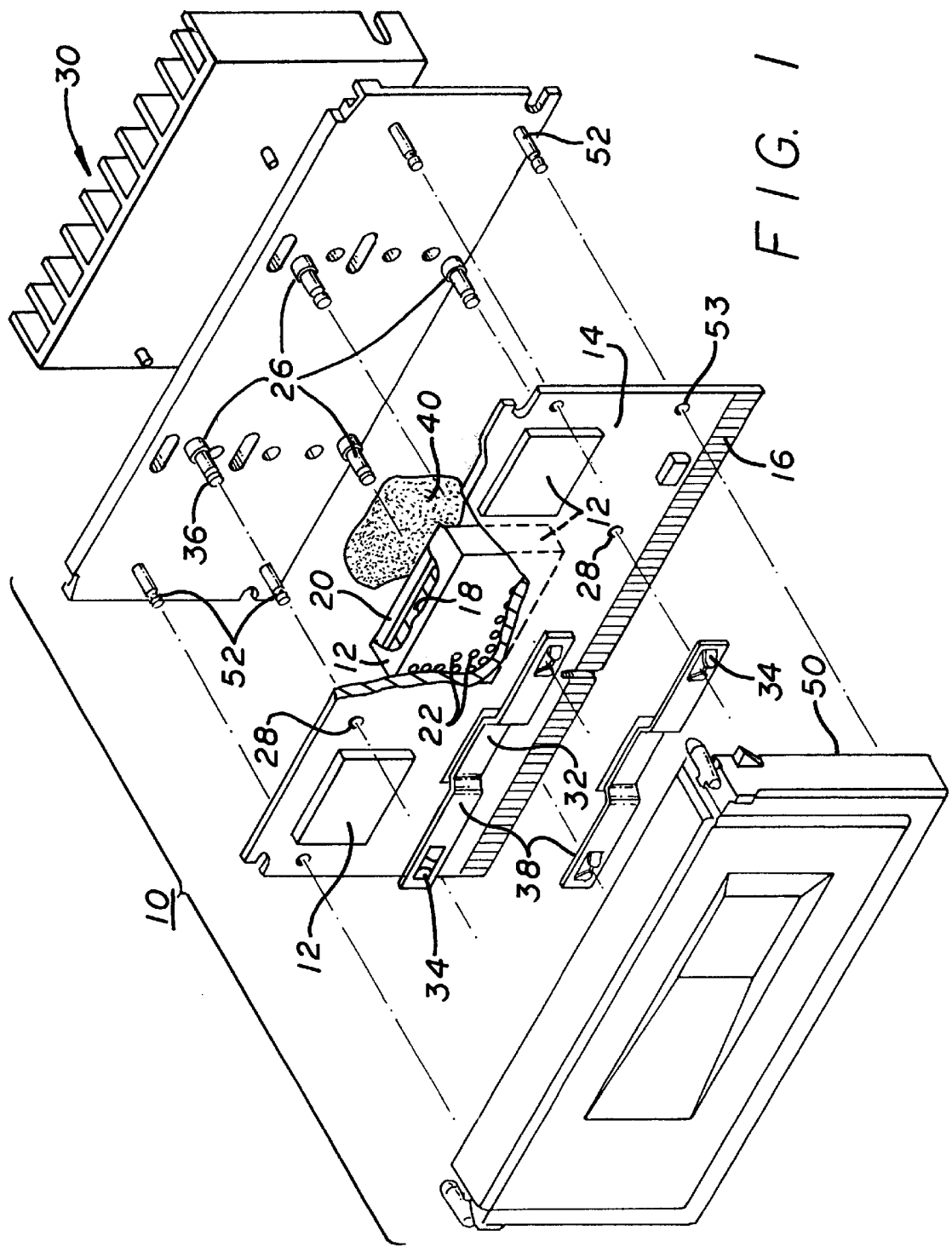
FIG. 1 is an exploded view of an embodiment of an electronic cartridge of the present invention.

One embodiment of the present invention is an electronic cartridge that includes a pair of spring clips which attach a thermal element to an integrated circuit or an integrated circuit package. The integrated circuit or integrated circuit package is mounted to a substrate. The substrate may be a printed circuit board. The cartridge may have a plurality of pins that extend from the thermal element and through the substrate. Each spring clip may have a pair of bent portions that are attached to the pins of the thermal element. The spring clip exerts a pull force that pulls the thermal element into the integrated circuit/package. The bent ports can be deflected so that at least a minimum pull force is always exerted onto the thermal element even with dimensional variations in the parts of the cartridge. The bent portions can therefore accommodate for tolerances in the cartridge while clamping the thermal element to the integrated circuit/package.

Referring to the drawings more particularly by reference numbers, FIGS. 1 and 2 show one embodiment of an electronic cartridge 10 of the present invention. The cartridge 10 may include an integrated circuit package 12 that is mounted to a substrate 14. The cartridge 10 may contain a number of integrated circuit packages 12 that are mounted to both sides of the substrate 14.

The substrate 14 may be a printed circuit board which contains electrical pads, visa and routing traces (not shown) as is known in the art. One edge of the substrate 14 may contain a plurality of conductive pads 16 that can be inserted into a card edge electrical connector (not shown). The card edge electrical connector is typically mounted to a motherboard (not shown) of a computer system.

The integrated circuit package 12 may contain one or more integrated circuits 18 and a metal lid 20. The integrated circuit 18 generates heat that may primarily flow into the metal lid 20. The package 12 may further have solder balls 22 that are attached to the substrate 14. Although solder balls 22 are shown and described, it is to be understood that other contacts such as pins may be employed in the present invention.

The cartridge 10 may have a thermal element 24 that is coupled to the integrated circuit package 12. The cartridge 10 may further have a plurality of first pins 26 that extend through clearance holes 28 in the substrate 14. The thermal element 24 may be a plate that is constructed from a thermally conductive material such as aluminum or copper. The pins 26 may be screwed or pressed into the plate. A finned heat sink 30 may be attached to the thermal element 24. Although a thermal plate 24 that is separate from the heat sink 30 is shown in described, it is to be understood that the thermal element 24 may include an integral finned heat sink.

The cartridge 10 may have a pair of spring clips 32 that are attached to the pins 26. The spring clips 32 secure the thermal element 24 to the substrate 14; Each spring clip 32 may have a pair of slots 34. Each pin 26 is inserted through a corresponding slot 34 of each clip 32. The pins 26 may each have a groove 36 that receives opposing edges of the clip 32. The edges reside in the grooves 36 and prevent the pins 26 from being pulled out of the slots 34.

Each slot 34 is located in a bent portion 38 of a spring 32. When assembled to the pin 26, the bent portions 38 are deflected to exert a pull force which pulls the thermal element 24 into the integrated circuit package 12. The pull force reduces the thermal impedance between the thermal element 24 and the integrated circuit package 12. A thermal grease 40 may be inserted in between the thermal element 24 and the metal lid 20 to further minimize the thermal impedance between the two components.

Variations in the dimensions of the cartridge parts may vary the deflection of the bent portions 38 and the pull force on the thermal element 24. The cartridge 10 is preferably designed so that the bent portions 38 are always deflected to provide at least a minimum pull force on the thermal element 24.

FIG. 3 shows an embodiment of a pin 26. The pin 26 may have a stud portion 42 that extends from a shoulder 44. The stud portion 42 is inserted into a corresponding hole of the thermal element 24. The pin 26 may have a plastic bushing 45 that is pressed onto the stud portion 42 and pressed into the thermal element 24. The shoulder 44 limits the insertion depth of the pin 26.

The pin 26 may also have a head portion 46 that is adjacent to a neck portion 48. The head portion 46 captures the spring clip 32. The distance D between the stud portion 42 and the head portion 46 is one of the dimensions which define the amount of deflection of the spring clip 32. The tolerance of dimension D is typically a small value to control the clip deflection and the pull force on the thermal element 24.

Referring to FIG. 1, the cartridge 10 may further have a cover 50 that is attached to the thermal element 24 by second pins 52 that extend through holes 53 in the substrate 14. The cover 50 and thermal element 24 may essentially enclose the integrated circuit packages 12.

FIG. 4 shows an embodiment of a second pin 52. The pin 52 may include a stud portion 54 that extends from a shoulder 56. A plastic bushing 58 may be pressed onto the stud portion 54 and pressed into the thermal element 24. The shoulder 56 limits the insertion depth of the pin 52.

The cartridge 10 can be assembled by merely sliding the pins 26 through the substrate 14 and snapping the spring clips 32 onto the pins 26. The thermal grease 40 can be applied to the thermal element 24 and/or metal lid 20 before the pins 26 are inserted through the substrate 14. The cover 50 can then be snapped onto the pins 52. The cartridge does not require tools and is relatively easy to assemble in a manufacturing production line.

While certain exemplary embodiments have been described and shown in the accompanying drawings, it is to be understood that such embodiments are merely illustrative of and not restrictive on the broad invention, and that this invention not be limited to the specific constructions and arrangements shown and described, since various other modifications may occur to those ordinarily skilled in the art. For example, as shown in FIG. 5, the thermal element 24 may be coupled directly to the integrated circuit 18 without a metal lid. With such a configuration the integrated circuit 18 is typically attached to a package substrate 60 with a process which is known as C4.

What is claimed is:

1. An electronic cartridge, comprising:

a substrate;

an integrated circuit mounted to said substrate;

a thermal element adjacent to said integrated circuit;

a pin that extends from said thermal element and through said substrate; and, a spring clip attached to said pin of said thermal element.

2. The cartridge as recited in claim 1, wherein said spring clip has a bent portion which exerts a force that pulls said thermal element toward said integrated circuit.

3. The cartridge as recited in claim 1, wherein said pin is inserted through a slot of said spring clip.

4. The cartridge as recited in claim 3, wherein said pin has a head portion and a groove that capture said spring clip.

5. The cartridge as recited in claim 1, further comprising a thermal grease located between said thermal element and said integrated circuit.

6. The cartridge as recited in claim 1, wherein said pin has a stud portion that extends from a shoulder of said pin, said stud portion being inserted into said thermal element.

7. A fastener to assemble an electronic cartridge, comprising:

a shoulder to limit insertion of said fastener into a thermal plate, a stud portion that extends from said shoulder on a first side, a neck portion that extends from said shoulder on a second side opposite said first side, a head portion at an end of said neck portion on said second side, said neck portion having a groove on said second side near said head portion, said groove to engage a spring clip such that said fastener is prevented from being pulled out there from, and said stud portion to couple into an opening in a thermal plate.

8. The fastener as recited in claim 7, further comprising:

a plastic bushing attached to said stud portion, said stud portion and said plastic bushing to be pressed into an opening in a thermal plate.

9. The fastener as recited in claim 7 wherein, said head portion of said fastener to engage a slot of a spring clip.

10. The fastener as recited in claim 7 wherein, said groove to receive a pair of opposing edges of a spring clip.

11. The fastener as recited in claim 7 wherein, the fastener to couple to a thermal plate at one end, extend through a substrate, and couple to a spring clip at an opposite end.

12. The fastener as recited claim 7 wherein, said stud portion includes threads suitable to screw said fastener into an opening in a thermal plate.

13. An electronic cartridge, comprising:

a substrate having an upper and a lower edge, the substrate having a first plurality of holes situated along the upper and lower edges of the substrate;

an integrated circuit package mounted to the substrate;

a thermal element adjacent to the integrated circuit package, the thermal element having a plurality of holes, at least two of the plurality of holes in the thermal element corresponding to at least two of the first plurality of holes situated along the upper and lower edges of the substrate;

a plurality of first pins having a first and second end, the second end having a plurality of threads, the plurality of first pins having the second end screwed into the plurality of holes of the thermal element and the first end inserted through a second plurality of holes of the substrate; and, a pair of spring clips attached to the plurality of first pins near the first end to hold the thermal element pressed against the integrated circuit package.

14. The electronic cartridge of claim 13, wherein, the pair of spring clips each have bent portions located at opposing edges of each which are deflected such that the pair of spring clips exert a pull force which pulls the thermal element into the integrated circuit package.

15. The electronic cartridge of claim 13, wherein, the pair of spring clips each have a pair of slots, each slot respectively engaged into a groove located on a neck portion of each of the plurality of first pins near the first end.

16. The electronic cartridge of claim 15, wherein, each slot has opposing edges residing in the groove of each of the plurality of first pins near the first end.

17. The electronic cartridge of claim 13, wherein, the substrat Contains a plurality of conductive pads, the conductive pads to be inserted into a card edge electrical connector.

18. The electronic cartridge of claim 13, wherein, each of the plurality of first pins has a stud portion extending from a shoulder, the stud portion having the plurality of threads in the second end to screw into the thermal element to a depth limited by the shoulder.

19. The electronic cartridge of claim 13, further comprising:

a heat sink that is mounted to the thermal element.

20. The electronic cartridge of claim 13, further comprising:

a cover wherein the cover and the thermal element fully enclose the integrated circuit package.

21. The electronic cartridge of claim 20, further comprising:

a plurality of second pins coupled to the thermal element at a second end and coupled to the cover at a first end.

22. The electronic cartridge of claim 21, wherein, each of the plurality of second pins includes
a stud portion that extends from a shoulder, and
a plastic bushing pressed onto the stud portion and pressed into the thermal element to secure the thermal element to the cover.

23. The electronic cartridge of claim 22, wherein, the shoulder of each limits insertion depth of the plurality of second pins.

24. A method to assemble an electronic cartridge comprising:

attaching an integrated circuit package to a substrate, the substrate having an upper edge and a lower edge and a first plurality of holes;

coupling a plurality of first pins to a thermal element;

sliding the plurality of first pins coupled to the thermal element through the first plurality of holes to thermally couple the thermal element to the integrated circuit package; and snapping at least one spring clip onto a pair of the plurality of first pins to secure the thermal element to the substrate.

25. The method of claim 24 further comprising:

prior to the sliding of the plurality of first pins,
pressing plastic bushings onto a stud portion of each of a plurality of second pins, coupling the plurality of second pins including the plastic bushings to the thermal element, and sliding the plurality of second pins through a second plurality of holes in the substrate coincident with the sliding of the plurality of first pins, and after the snapping of the at least one spring clip,
snapping a cover onto the plurality of second pins.

26. The method of claim 24, further comprising:

prior to the sliding of the plurality of first pins into the first plurality of holes of the substrate,
applying a thermal grease between the integrated circuit package and the thermal element.

27. The method of claim 24, wherein, the plurality of first pins are pressed into the thermal element, and a shoulder of each of the plurality of first pins limits insertion depth.

28. The method of claim 24, wherein, the first plurality of pins are screwed into the thermal element, and a shoulder of each of the plurality of first pins limits insertion depth.

29. The method of claim 24, wherein, the thermal element includes an integral finned heat sink.

30. The method of claim 24, further comprising:

coupling a heat sink to the thermal element.

31. The method of claim 24, wherein, the snapping of at least one spring clip includes respectively snapping a first spring clip onto a first pair of the plurality of first pins and snapping a second spring clip onto a second pair of the plurality of first pins.

32. The method of claim 24, wherein, the snapping of the at least one spring clip includes
inserting a pair of the plurality of first pins into a corresponding pair of slots in the at least one spring clip.

33. The method of claim 32, wherein, the snapping of at least one spring clip further includes deflecting bent portions of each of the corresponding pair of slots in the at least one spring clip to exert a pull force and reduce thermal impedance between the thermal element and the integrated circuit package.

34. The method of claim 24, further comprising:

prior to the sliding of the plurality of first pins into the first plurality of holes in the substrate,
coupling a plurality of second pins to the thermal element;
sliding the plurality of second pins coupled to the thermal element through a second plurality of holes in the substrate coincident with the sliding of the first plurality of pins; and after snapping the at least one spring clip onto the pair of the plurality of first pins,
snapping a cover onto the plurality of second pins to secure the cover over the substrate.

35. The method of claim 34, wherein, the thermal element includes an integral finned heat sink.

36. The method of claim 34, further comprising:

prior to sliding the plurality of second pins coupled to the thermal element through the second plurality of holes in the substrate coincident with the sliding of the first plurality of pins,
applying a thermal grease between the integrated circuit package and the thermal element.

37. The method of claim 34, wherein,
the plurality of second pins are pressed into the thermal element, and a shoulder of each of the plurality of second pins limits insertion depth.

38. The method of claim 34, wherein,
the plurality of second pins are screwed into the thermal element, and a shoulder of each of the plurality of second pins limits insertion depth.

39. The method of claim 34, wherein,
the snapping of at least one spring clip includes respectively snapping a first spring clip onto a first pair of the plurality of first pins and snapping a second spring clip onto a second pair of the plurality of first pins.

40. The method of claim 34, wherein,
the snapping of the at least one spring clip includes
inserting a pair of the plurality of first pins into a corresponding pair of slots in the at least one spring clip.

41. The method of claim 40, wherein,
the snapping of the at least one spring clip further includes deflecting bent portions of each of the corresponding pair of slots in the at least one spring clip to exert a pull force and reduce thermal impedance between the thermal element and the integrated circuit package.

* * * * *

UNITED STATES PATENT AND TRADEMARK OFFICE
CERTIFICATE OF CORRECTION

PATENT NO. : 6,381,136 B1
DATED : April 30, 2002
INVENTOR(S) : Nelson et al.

It is certified that error appears in the above-identified patent and that said Letters Patent is hereby corrected as shown below:

<u>Title page,</u>
Item [57], ABSTRACT,
Line 10, delete "ports" and insert -- portions --.

<u>Column 2,</u>
Line 17, delete "ports" and insert -- portions --.
Line 32, delete "visa" and insert -- vias --.

<u>Column 5,</u>
Line 20, delete "substrat Contains" and insert -- substrate contains --.

Signed and Sealed this

Twentieth Day of August, 2002

*Attest:*

*Attesting Officer*

JAMES E. ROGAN
*Director of the United States Patent and Trademark Office*